(12) United States Patent
Zhang

(10) Patent No.: US 8,154,338 B2
(45) Date of Patent: Apr. 10, 2012

(54) OFFSET CANCELLATION FOR DIFFERENTIAL CIRCUITS

(75) Inventor: Bo Zhang, Rancho Santa Margarita, CA (US)

(73) Assignee: Broadcom Corporation, Irvine, CA (US)

( * ) Notice: Subject to any disclaimer, the term of this patent is extended or adjusted under 35 U.S.C. 154(b) by 105 days.

(21) Appl. No.: 12/822,811

(22) Filed: Jun. 24, 2010

(65) Prior Publication Data

US 2011/0316629 A1 Dec. 29, 2011

(51) Int. Cl.
*H03F 1/02* (2006.01)

(52) U.S. Cl. .......................................................... 330/9

(58) Field of Classification Search ................ 330/9, 51, 330/252–261; 327/124, 307, 554
See application file for complete search history.

(56) References Cited

U.S. PATENT DOCUMENTS

| 6,531,907 | B2 * | 3/2003 | Dooley et al. ................. 327/307 |
| 7,548,115 | B1 * | 6/2009 | Liu ............................... 330/258 |
| 7,812,665 | B2 * | 10/2010 | Eschauzier et al. ............... 330/9 |
| 8,040,180 | B2 * | 10/2011 | Yen et al. ........................ 330/10 |

* cited by examiner

*Primary Examiner* — Hieu Nguyen
(74) *Attorney, Agent, or Firm* — Sterne, Kessler, Goldstein, Fox & P.L.L.C.

(57) ABSTRACT

An offset cancellation circuit for canceling an offset voltage in an amplifier is provided herein. The offset cancellation circuit includes a current source configured to provide an offset current, a switching stage comprising first and second switches, and a cascode stage. The cascode stage comprises a first cascode device configured to receive the offset current from the first switch and inject the offset current into a first differential end of the amplifier, and a second cascode device configured to receive the offset current from the second switch and inject the offset current into a second differential end of the amplifier. Offset voltages are common to many differential circuits as a result of mismatch. The injection of current by the offset cancellation circuit can reduce or eliminate an offset voltage, while the cascode stage can prevent parasitic capacitance associated with the offset cancellation circuit from creating further mismatch.

20 Claims, 8 Drawing Sheets

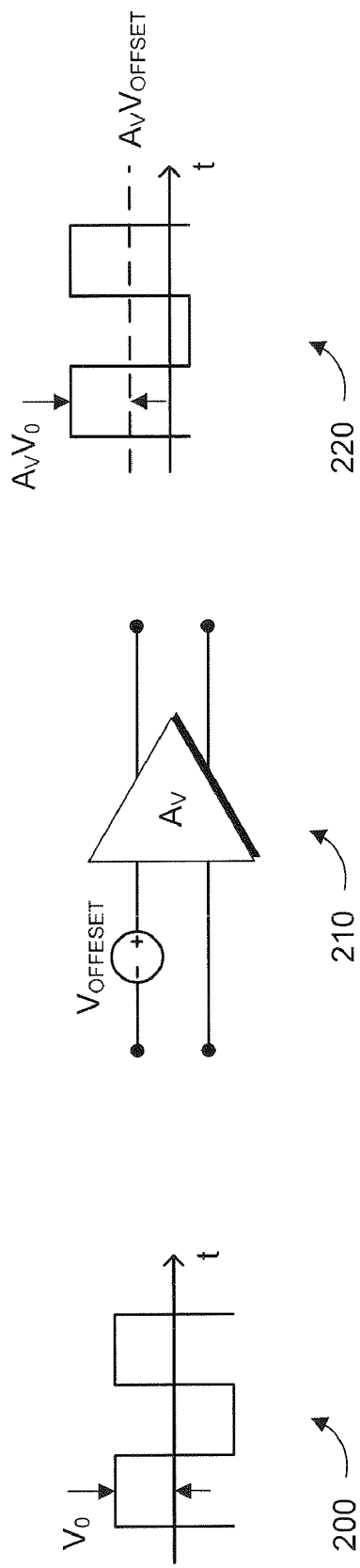
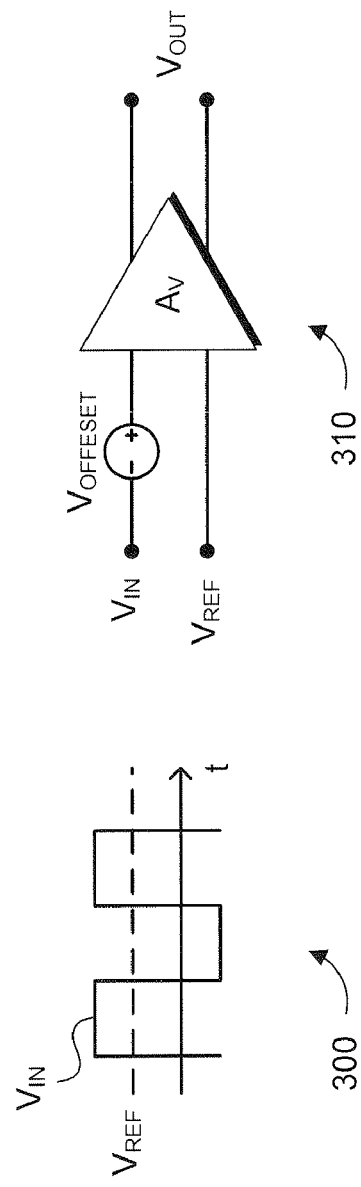
FIG. 2
FIG. 3

OFFSET CANCELLATION FOR DIFFERENTIAL CIRCUITS

FIELD OF THE INVENTION

This application relates generally to offset cancellation and more particularly to offset cancellation for differential circuits.

BACKGROUND

There exist several types of non-idealities that limit the performance of analog circuits. For example, common types of non-idealities include frequency response, noise, nonlinearity, and mismatch. Mismatch is particularly important in the design of high-precision differential circuits, such as differential amplifiers, that include two, ideally symmetric sides. Because of mismatches, the two sides of a differential circuit typically do not exhibit identical properties and bias currents, leading to adverse effects in the performance of these circuits.

In an integrated circuit (IC), mismatches in a differential circuit result from microscopic variations in devices used to implement the differential circuit. For example, random, microscopic variations in the length and width of the gates of two transistors (e.g., MOSFETs) that are identically laid out and used on each side of a differential circuit result in mismatch. In addition, random variances in doping levels in the channels and gates of two identically laid out devices result in threshold ($V_{TH}$) mismatches.

A traditional approach to reducing the adverse effects of mismatches in a differential circuit is to increase the size of the devices used in its implementation. For example, in a differential circuit that uses MOSFET devices, the width and length of those devices can be increased to reduce their relative mismatches, $\Delta W/W$ and $\Delta L/L$. The magnitude of the relative mismatches decreases because as W and L increase, random variations experience greater "averaging." However, increasing W and L correspondingly results in a higher power requirement and/or a lower speed at which these larger devices can operate.

More specifically, the dynamic power of a MOSFET device is generally given by the following equation:

$$P_{dynamic} = CV_{DD}^2 f$$

where C is the channel capacitance (which is proportional to WL), $V_{DD}$ is the supply voltage, and f is the switching frequency or average switching frequency of the MOSFET. As can be readily seen, any increase in W or L leads to an increase in the channel capacitance C and a corresponding increase in the dynamic power consumption of the MOSFET. To compensate for the additional power requirement, the frequency or speed at which the device operates can be reduced or additional power can be supplied. Either way, there is a tradeoff between increasing the size of the device to limit the magnitude of relative mismatches and the power and/or speed at which the device operates.

Therefore, what is needed is a system for minimizing the adverse effects caused by mismatches used in the implementation of differential circuits, while at the same time limiting additional power requirements and/or speed limitations.

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention.

FIG. 2 illustrates a limitation imposed on a differential amplifier as a result of an offset voltage caused by random mismatches.

FIG. 3 illustrates another limitation imposed on a differential amplifier as a result of an offset voltage caused by random mismatches.

Figure 8:
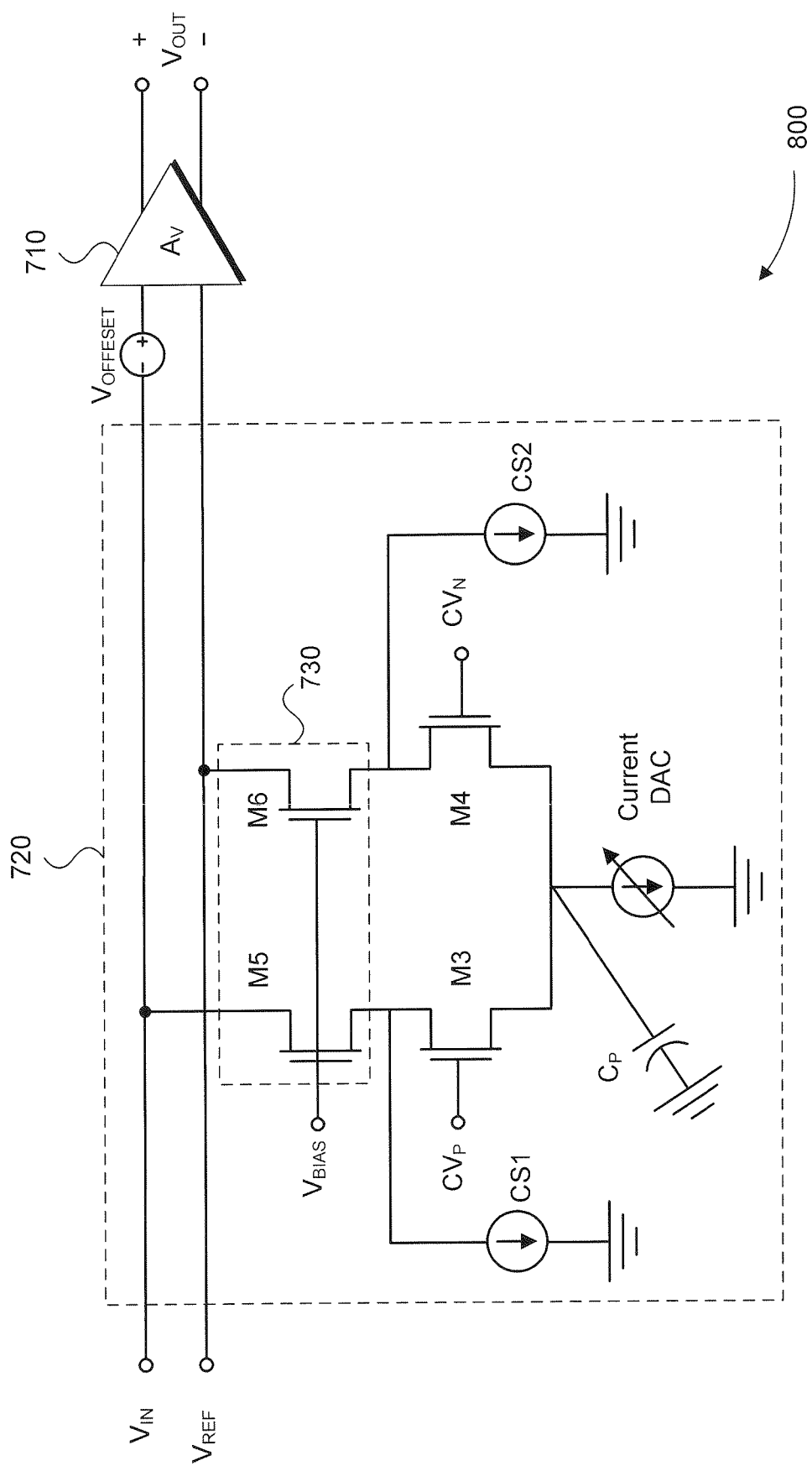
FIG. 8 illustrates a variation of the differential amplifier configuration with an offset cancellation circuit illustrated in FIG. 7, according to embodiments of the present invention.
Figure 9:
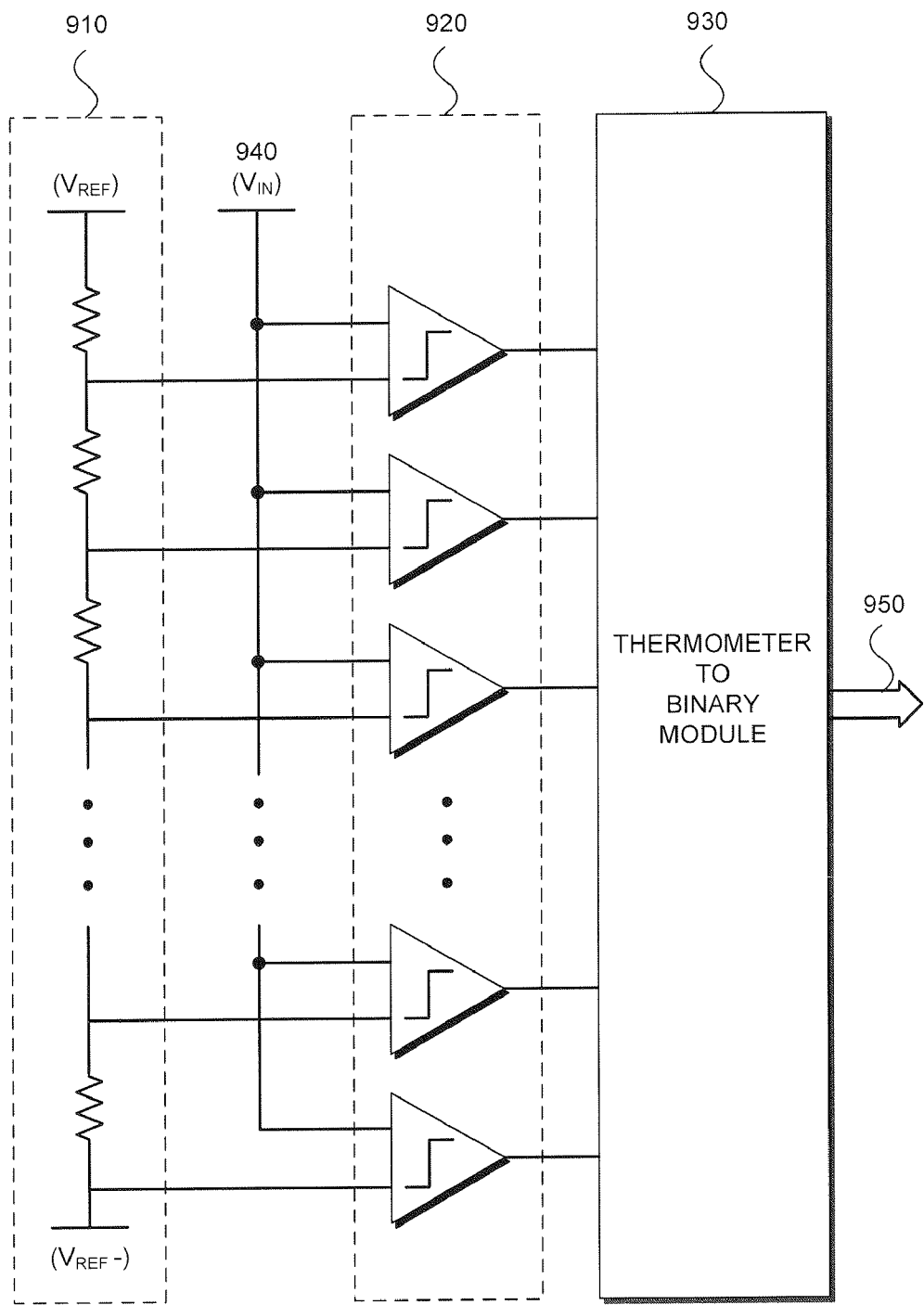

FIG. 9 illustrates one exemplary operating environment or device that can benefit from the use of offset cancellation circuit 720 illustrated in FIG. 7 and FIG. 8, according to embodiments of the present invention The present invention will be described with reference to the accompanying drawings. The drawing in which an element first appears is typically indicated by the leftmost digit(s) in the corresponding reference number.

DETAILED DESCRIPTION

In the following description, numerous specific details are set forth in order to provide a thorough understanding of the invention. However, it will be apparent to those skilled in the art that the invention, including structures, systems, and methods, may be practiced without these specific details. The description and representation herein are the common means used by those experienced or skilled in the art to most effectively convey the substance of their work to others skilled in the art. In other instances, well-known methods, procedures, components, and circuitry have not been described in detail to avoid unnecessarily obscuring aspects of the invention.

References in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to effect such feature, structure, or characteristic in connection with other embodiments whether or not explicitly described.

Figure 1:
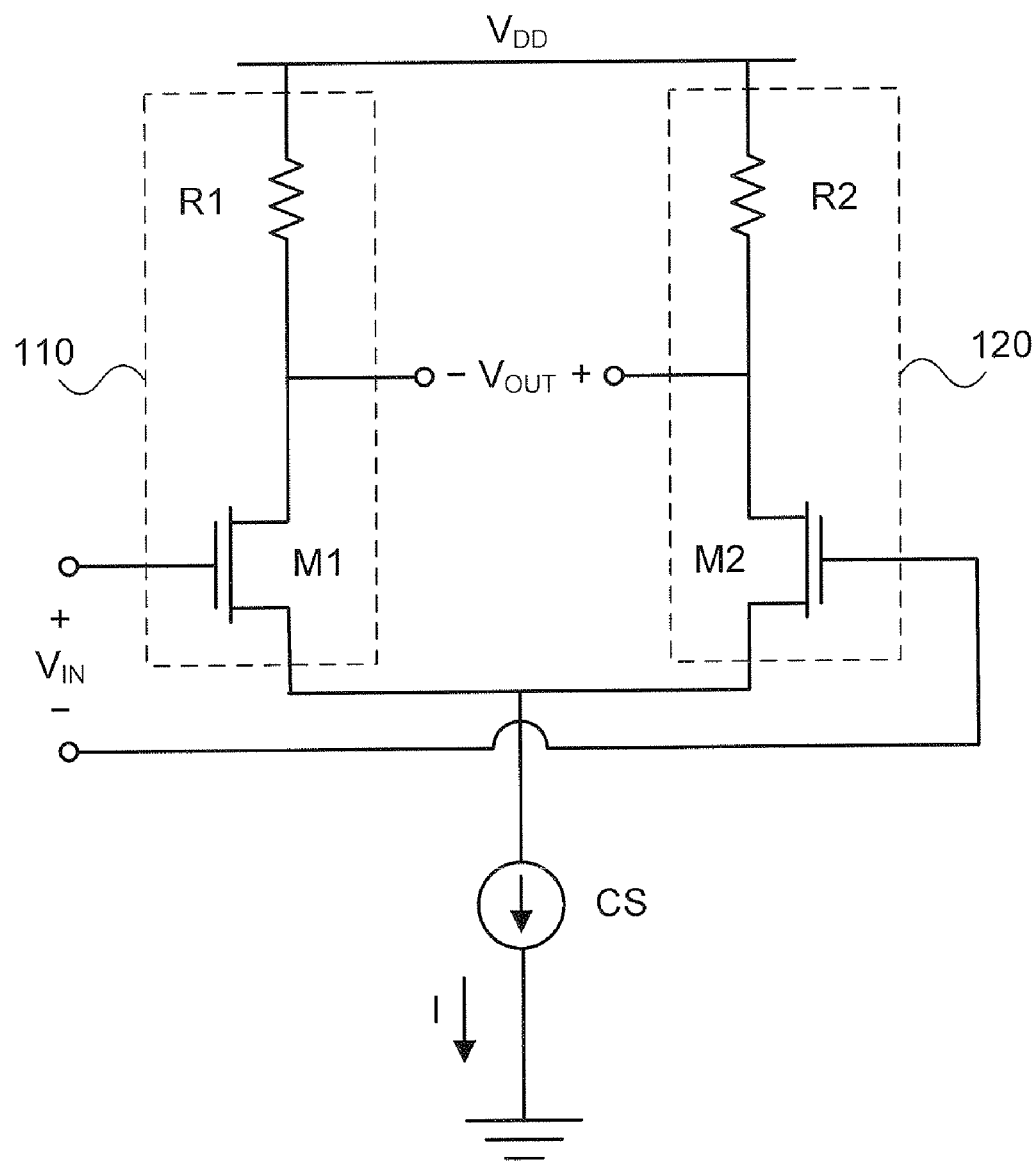
FIG. 1 illustrates an exemplary differential amplifier, according to embodiments of the present invention.

FIG. 1 illustrates an exemplary differential amplifier 100, according to embodiments of the present invention. Amplifier 100 includes a pair of NMOS transistors M1 and M2 that have their sources coupled to each other and to current source CS.

Current source CS behaves as a current sink and draws a predetermined, constant current from transistors M1 and M2. The gate of transistor M1 receives a first, positive end of differential input signal $V_{IN}$ and the gate of M2 receives a second, negative end of differential input signal $V_{IN}$. The drains of M1 and M2 are coupled to supply voltage $V_{DD}$ through respective load resistors R1 and R2. In an embodiment, load resistors R1 and R2 are implemented using a current mirror formed from two or more transistors. An output voltage $V_{OUT}$ is generated by differential amplifier 100 that corresponds to the voltage difference between the two ends of differential input signal $V_{IN}$.

NMOS transistor M1 and load resistor R1 form a first side 110 of differential amplifier 100 and NMOS transistor M2 and load resistor R2 form a second side 120 of differential amplifier 100. In an ideal implementation, first side 110 and second side 120 are perfectly symmetrical.

In operation, when the magnitude of the positive end of differential input signal $V_{IN}$ increases and the magnitude of the negative end of differential input signal $V_{IN}$ decreases, the percentage of the current I conducted by transistor M1 increases and the percentage of the current I conducted by transistor M2 decreases. However, the total current flowing through the two transistors M1 and M2 remains substantially constant. As a result of the increased current flowing through transistor M1, the voltage drop across resistor R1 increases, and as a result of the decreased current flowing through M2, the voltage drop across resistor R2 decreases. The increased voltage drop across resistor R1 will cause the negative end of output voltage $V_{OUT}$ to decrease, and the decreased voltage drop across resistor R2 will cause the positive end of output voltage $V_{OUT}$ to increase. Typically, the change in output voltage $V_{OUT}$ is much greater than the change in input voltage $V_{IN}$. Differential amplifier 100 will respond in an opposite manner as described above for a decrease in magnitude of the positive end of differential input signal $V_{IN}$ and an increase in magnitude of the negative end of differential input signal $V_{IN}$.

In an ideal implementation of differential amplifier 100, the two sides 110 and 120 are perfectly symmetrical and produce equal currents and output voltages for the same input signal. However, in the presence of mismatches the symmetry between the two sides 110 and 120 of differential amplifier 100 breaks down and the circuit generally will suffer from a dc "offset." With perfect symmetry, if $V_{IN}=0$ then $V_{OUT}=0$. However, in the presence of mismatches, if $V_{IN}=0$ then $V_{OUT} \neq 0$. The observed value of $V_{OUT}$ when $V_{IN}$ is zero volts is the dc "offset" of the circuit. Typically, this dc "offset" is expressed as an input referred offset voltage $V_{OFFSET}$, which is defined as the input voltage that causes the output voltage to go to zero volts.

In an IC, mismatches in a differential circuit result from microscopic variations in devices. For example, random, microscopic variations in the length and width of the gates of transistors M1 and M2, assumed to be identically laid out, result in mismatch. In addition, random variances in doping levels in the respective channels and gates of identically laid out transistors M1 and M2 result in threshold mismatch.

It should be noted that exemplary differential amplifier 100 illustrated in FIG. 1 is provided for the purpose of illustration and not limitation. Other equivalent implementations and/or variations of exemplary differential amplifier 100 are possible as would be understood by a person skilled in the art based on the teachings herein. Equivalent implementations and/or variations may include, for example, variations in transistor type (e.g., PNP, BJT, JFET, BiCMOS, etc.), variations in amplifier configuration (e.g., common-collector, common-base, common-drain, common-gate, Darlington pair, Cascode, Sziklai pair, etc.), and variations in amplifier input/output configuration (e.g., a fully differential implementation). It should be further noted that other types of devices, such as bipolar junction transistors and junction gate field-effect transistors suffer from similar mismatches as the MOSFET devices described above.

FIG. 2 illustrates a potential limitation imposed on a differential amplifier, such as differential amplifier 100, as a result of an offset voltage caused by random mismatches. Specifically, FIG. 2 illustrates a differential input signal 200 that swings from $+V_0$ to $-V_0$, a differential amplifier 210 with an input referred offset voltage $V_{OFFSET}$, and a differential output signal 220.

The differential input signal 200 is received at the input of differential amplifier 210 and is amplified to produce differential output signal 220. As can be seen from FIG. 2, amplified versions of both differential input signal 200 and the input referred offset voltage $V_{OFFSET}$ are present in differential output signal 220. The input referred offset voltage $V_{OFFSET}$ essentially shifts the amplified version of differential input signal 200 at the output of amplifier 210. In this specific instance, the input referred offset voltage $V_{OFFSET}$ is positive. However, the input referred offset voltage is, in general, randomly defined and can be either positive or negative in value. In instances where amplifier 210 is used in cascade with another amplifier coupled to the output of amplifier 210, the input referred offset voltage $V_{OFFSET}$ can result in saturation of the other amplifier and drive it and latter stages into non-linear operation. This represents one potential limitation imposed by random mismatches.

FIG. 3 illustrates another potential limitation imposed on a differential amplifier 310 as a result of an offset voltage caused by random mismatches. More specifically, FIG. 3 illustrates another potential limitation when differential amplifier 310 is being used to determine whether one input signal of the amplifier is greater than or less than the other input signal of the amplifier.

As illustrated in FIG. 3, a time-varying voltage signal $V_{IN}$, coupled to a first input of differential amplifier 310, is essentially being compared to a reference voltage $V_{REF}$, coupled to a second input of differential amplifier 310. Differential amplifier 310, as illustrated in FIG. 3, can be used in a comparator or a slicer device, for example. The input referred offset voltage $V_{OFFSET}$ limits the minimum difference $V_{IN} - V_{REF}$ that can be reliably detected by differential amplifier 310, representing another potential limitation imposed by random mismatches. For example, if the input referred offset voltage $V_{OFFSET}$ is 0.2 V, then when $V_{IN}$ is 4.4 V and $V_{REF}$ is 4.45 V a negative, differential output voltage should be produced by differential amplifier 310 at its output (assuming $V_{IN}$ is coupled to the positive input of differential amplifier 310). However, because of the 0.2 V input referred offset voltage, when $V_{IN}$ is 4.4 V and $V_{REF}$ is 4.45 V a positive, differential output voltage is produced by differential amplifier 310 at its output.

Figure 4:
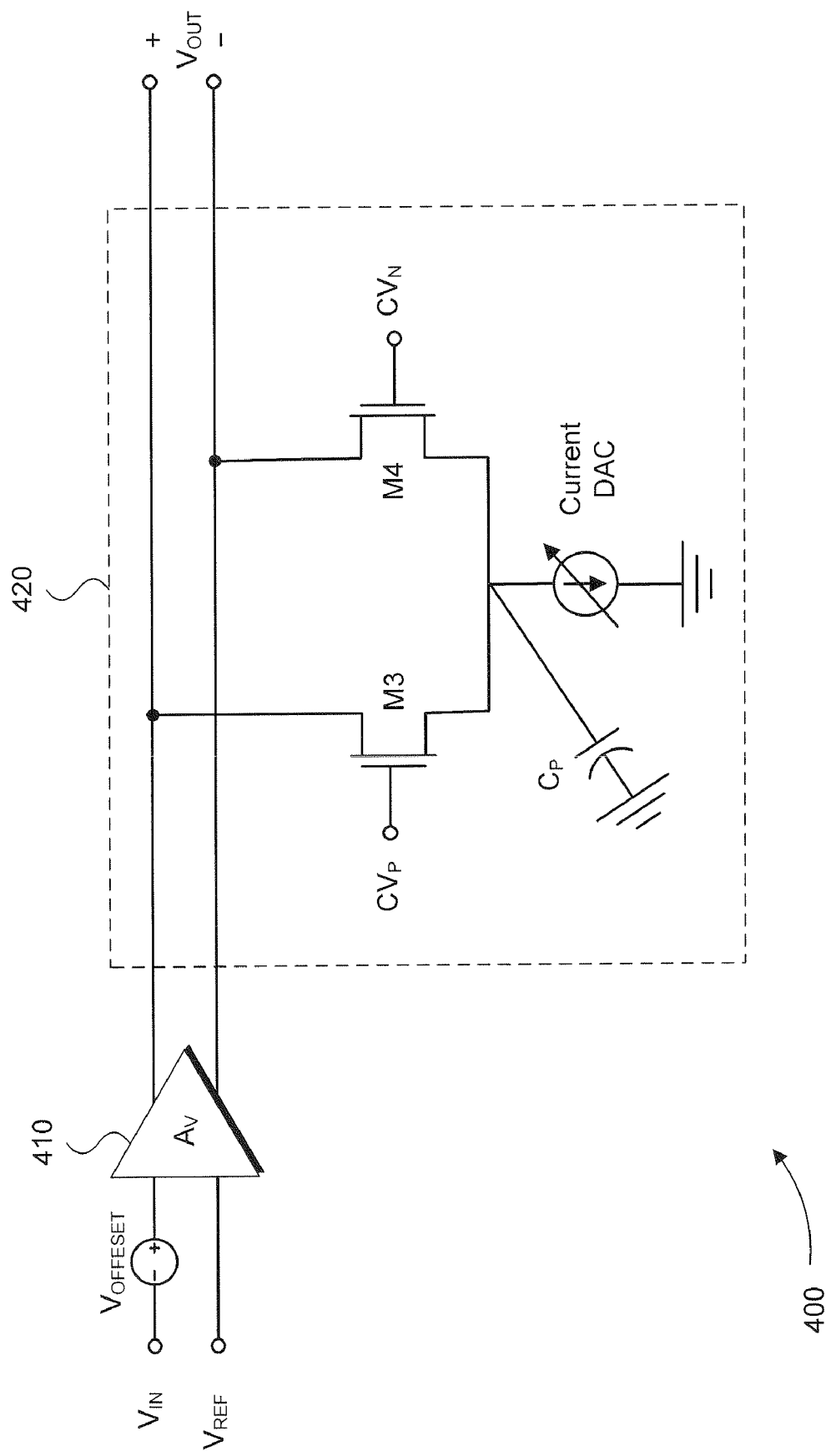
FIG. 4 illustrates a differential amplifier configuration with an offset cancellation circuit, according to embodiments of the present invention.

FIG. 4 illustrates a differential amplifier configuration 400 for minimizing the potential limitations caused by mismatches, according to embodiments of the present invention. Differential amplifier configuration 400 includes a differential amplifier 410 and an offset cancellation circuit 420. Again, it should be noted that $V_{OFFSET}$ is randomly defined and can be either positive or negative in value.

In operation, differential amplifier 410 receives input signals $V_{IN}$ and $V_{REF}$ and amplifies the difference between these two signals to provide output signal $V_{OUT}$. The input referred offset voltage $V_{OFFSET}$ represents the mismatch between the ideally symmetric sides of differential amplifier 410 (not shown). For example, assuming inputs $V_{IN}$ and $V_{REF}$ are equal, the current through the ideally symmetrical sides of differential amplifier 410 is expected to be equal, and therefore the differential output signal $V_{OUT}$ is expected to be zero. However, because of random mismatches, these two currents differ. Two exemplary limitations imposed on differential amplifier 410 because of these mismatches were illustrated in FIG. 2 and FIG. 3, described above.

Offset cancellation circuit 420 is configured to reduce or eliminate any difference between the amount of current flowing in the two sides of differential amplifier 410 for the same given input value received by both sides by injecting current into one side of differential amplifier 410. More specifically, in the embodiment of FIG. 4, offset cancellation circuit 420 is configured to inject current into the side of differential amplifier 410 that produces a higher output voltage for the same given input signal, such that the two sides produce substantially equal output values when $V_{IN}$ is equal to $V_{REF}$.

Offset cancellation circuit 420 includes two NMOS devices M3 and M4, coupled together at their sources to a current mode digital-to-analog converter (DAC) and at their drains to respective ends of the differential output $V_{OUT}$ of differential amplifier 410. At their gates, NMOS devices M3 and M4 are respectively coupled to control signals $CV_P$ and $CV_N$. The two control signals turn one of the two NMOS devices M3 and M4 on at any given time, depending on which side of differential amplifier 410 requires an additional injection of current. More specifically, the NMOS device on the side of differential amplifier 410 that requires an additional injection of current (thereby lowering its output voltage) is turned on, while the other NMOS device is turned off. The amount of current injected by offset cancellation circuit 420 is controlled by the current controlled DAC.

For example, assuming that the side of differential amplifier 410 that provides the positive end of differential output $V_{OUT}$ requires the additional injection of current, control signal $CV_P$ will be controlled to turn transistor M3 on and control signal $CV_N$ will be controlled to turn transistor M4 off. The additional injection of current will lower the voltage output produced at the positive end of differential output $V_{OUT}$ for any given input value of $V_{IN}$. The current controlled DAC of offset cancellation circuit 420 can be controlled to provide the necessary current to substantially cancel the effect of the input referred offset voltage $V_{OFFSET}$, such that when $V_{IN}=V_{REF}$, $V_{OUT}=0$.

In an embodiment, the current controlled DAC is constructed from a number of parallel current sources that can be independently switched on or off to control the amount of current provided. In another embodiment, the current controlled DAC can be replaced by any dependent current source that is controlled to provide the appropriate amount of current (to one side of differential amplifier 410) necessary to eliminate the input referred offset voltage.

Figure 5:
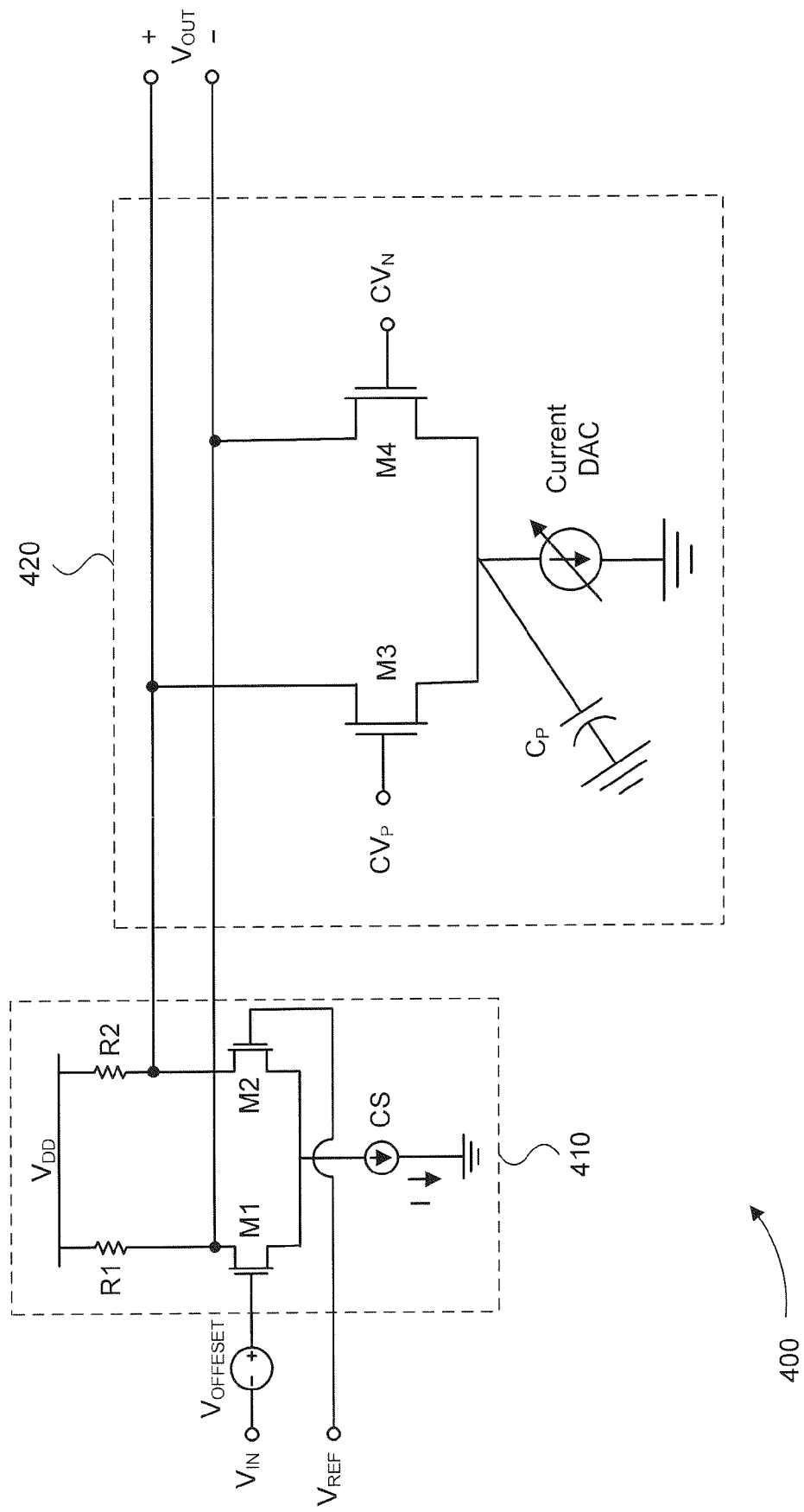
FIG. 5 illustrates a differential amplifier configuration with an offset cancellation circuit and the exemplary differential amplifier illustrated in FIG. 1, according to embodiments of the present invention.

FIG. 5 illustrates the differential amplifier configuration 400 of FIG. 4 with differential amplifier 410 implemented as the exemplary differential amplifier 100 illustrated in FIG. 1, according to embodiments of the present invention. The embodiment of FIG. 5 illustrates in further detail the coupling of offset cancellation circuit 420 to this exemplary implementation of differential amplifier 410.

As noted above, offset cancellation circuit 420 is configured to inject current into the side of differential amplifier 410 that produces a higher output voltage for the same given input signal, such that the two sides produce substantially equal output values when $V_{IN}$ is equal to $V_{REF}$. For example, assuming the side of differential amplifier 410, illustrated in FIG. 5, that includes resistor R2 produces a larger output voltage than the opposite side of differential amplifier 410, then offset cancellation circuit can inject (or pull) more current through resistor R2, thereby lowering that sides output voltage for any given input signal. The amount of current injected (or pulled) in one side of differential amplifier 410 can be controlled to substantially cancel or eliminate the input referred offset voltage $V_{OFFSET}$.

It should be noted that exemplary differential amplifier 410 illustrated in FIG. 5 is provided for the purpose of illustration and not limitation. Other equivalent implementations and/or variations of exemplary differential amplifier 410 are possible as would be understood by a person skilled in the art based on the teachings herein. Equivalent implementations and/or variations may include, for example, variations in transistor type (e.g., PNP, BJT, JFET, BiCMOS etc.), variations in amplifier configuration (e.g., common-collector, common-base, common-drain, common-gate, Darlington pair, Cascode, Sziklai pair, etc.), and variations in amplifier input/output configuration (e.g., a fully differential implementation). It should be further noted that other types of devices, such as bipolar junction transistors and junction gate field-effect transistors suffer from similar mismatches as the MOSFET devices described above.

Referring back to FIG. 4, although offset cancellation circuit 420 can substantially eliminate the effects of mismatch that result because of manufacturing variations in the devices used to implement differential amplifier 410, offset cancellation circuit 420 can actually create additional mismatch in differential amplifier 410 as will be explained further below. More specifically, a parasitic capacitance $C_P$ of offset cancellation circuit 420 exists between the source coupled nodes of NMOS transistors M3 and M4 and the current DAC as illustrated. This parasitic capacitance $C_P$ is the result of coupling between NMOS transistors M3 and M4, and the load of the current DAC, for example. Because only one of either NMOS transistor M3 or M4 is on at any given time, this parasitic capacitance essentially is coupled to only one side of the output of differential amplifier 410. In particular, parasitic capacitance $C_P$ is coupled to the side of differential amplifier 410 that corresponds to the NMOS transistor M3 or M4 that is on. The NMOS transistor that is off imposes a high impedance path between the output of differential amplifier 410 and the parasitic capacitance $C_P$, while the NMOS transistor that is on imposes a low impedance path between the output of differential amplifier 410 and the parasitic capacitance $C_P$.

The parasitic capacitance $C_P$ generally is very small. However, this small parasitic capacitance $C_P$ can become relevant very quickly as the speed at which differential amplifier 410 is operated increases. For example, at operating speeds in the GHz range, the uneven coupling of parasitic capacitance $C_P$ to one side of differential amplifier 410 can become significant as explained further below in regard to FIG. 6.

It should be noted that offset cancellation circuit 420 illustrated in FIG. 4 represents an NMOS presentation of this device. However, as will be appreciated by one of ordinary skill in the art, a PMOS presentation of offset cancellation circuit 420, utilizing PMOS devices, can be constructed and used without departing from the scope and spirit of the present invention. In addition, it should be further noted that equivalent implementations and/or variations of offset cancellation circuit 420 may include variations in transistor type (e.g., PNP, BJT, JFET, BiCMOS etc.) without departing from the scope and spirit of the present invention.

Figure 6:
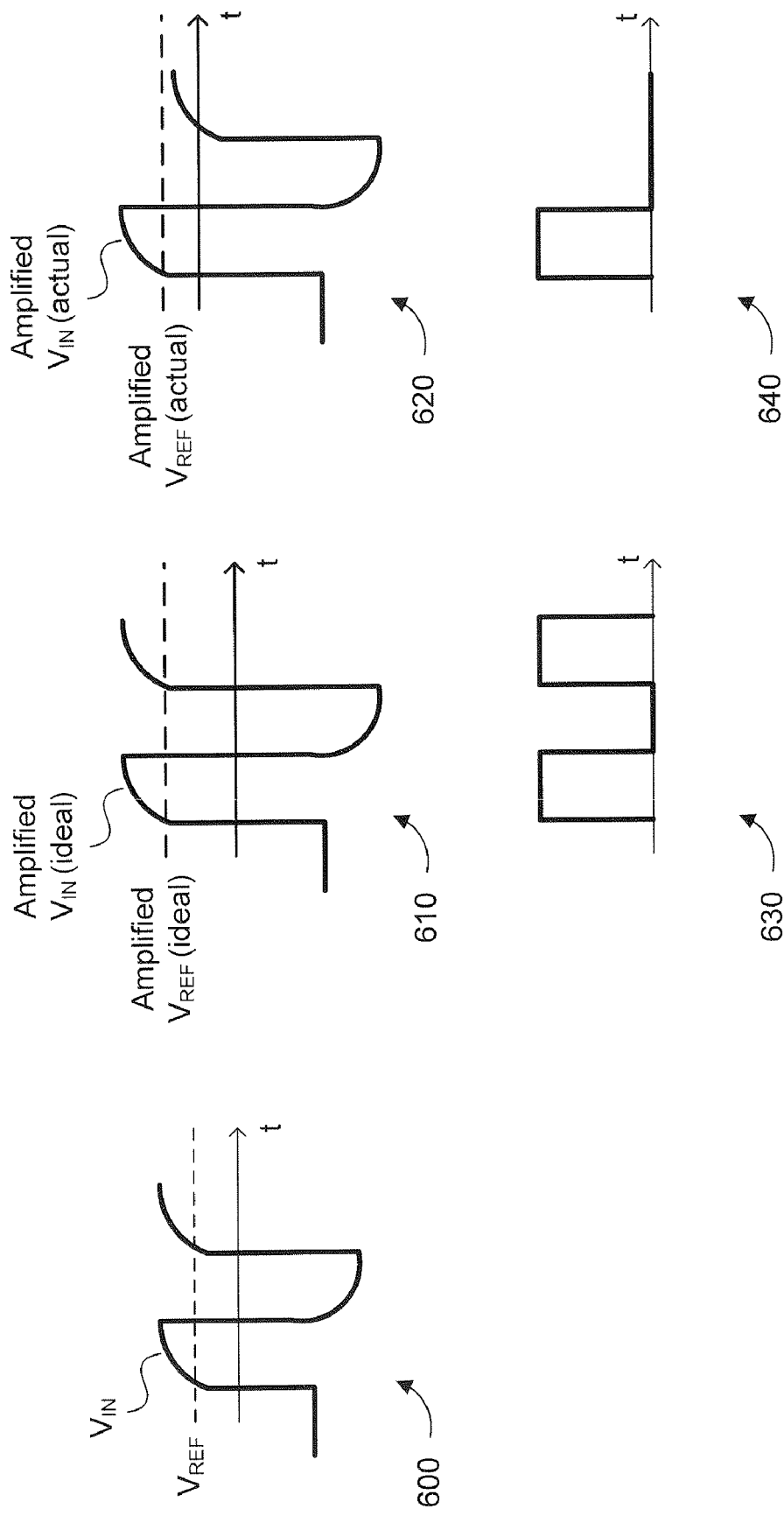
FIG. 6 illustrates a potential adverse effect of the offset cancellation circuit illustrated in FIG. 4, according to embodiments of the present invention.

FIG. 6 illustrates the adverse effect that parasitic capacitance $C_P$ can have on the operation of differential amplifier 410, according to embodiments of the present invention. Assuming the example input signal 600 of $V_{IN}$ and $V_{REF}$ is received by differential amplifier 410 illustrated in FIG. 4, the ideal output signal 610 of each end of differential output $V_{OUT}$ is shown. As can be seen, ideal output signal 610 shows that each input signal $V_{IN}$ and $V_{REF}$ is amplified and remains in the same, relative proportion to each other. In other words, input signals $V_{IN}$ and $V_{REF}$ are equivalently amplified and maintain the same magnitude relationship over time.

If it is now further assumed that offset cancellation circuit 420 is injecting current into the end of differential output $V_{OUT}$ that provides the amplified version of $V_{IN}$ (to compensate for an input referred offset voltage), then the potential or actual output signal produced is shown as 620 in FIG. 6. In the specific instance, where offset cancellation circuit 420 is injecting current into the end of differential output $V_{OUT}$ that provides the amplified version of $V_{IN}$, the NMOS device M3 is on and the NMOS device M4 is off. This on/off configuration of the NMOS devices M3 and M4 results in the coupling of parasitic capacitance $C_P$ to the end of differential output $V_{OUT}$ providing the amplified version of $V_{IN}$, thereby creating a mismatch between the two sides of differential amplifier 410.

If differential amplifier 410 is operating at a sufficient speed such that the parasitic capacitance $C_P$ is non-negligible, the potential or actual output of differential amplifier 410 for input signal 600 may more closely resemble output signal 620, rather than that of output signal 610. As can be seen from output signal 620, the second upswing of amplified $V_{IN}$ is slow to rise to its full, expected value above amplified $V_{REF}$. The slow upswing is the result of parasitic capacitance $C_P$, which after a large downswing of amplified $V_{IN}$ may be discharged and may take considerable time to recharge during the upswing. The slow recharging of parasitic capacitance may prevent amplified $V_{IN}$ from reaching its full expected value above amplified $V_{REF}$ in the time allotted.

More specifically, assuming that differential amplifier 410 is used in a comparator that compares input signal $V_{IN}$ to input reference voltage $V_{REF}$, and the comparator provides a 1-bit output that is either high or low depending on whether $V_{IN}$ is less than or greater than $V_{REF}$, then each comparison result or output sample is typically performed in some predetermined time period. In some devices, the comparator can be pushed to generate results or samples at a frequency in the multi-GHz range. Due to the high operating frequency, the extra time it takes for amplified $V_{IN}$ to swing back up to its expected value above amplified $V_{REF}$ because of the loading effects of parasitic capacitance $C_P$, may result in an ultimate output value of the comparator (implementing differential amplifier 410) being incorrect. In other words, because $V_{IN}$ may not reach its expected value above amplified $V_{REF}$ in time, the comparator may determine incorrectly that $V_{IN}$ is less than $V_{REF}$.

Sample outputs of such a comparator for the ideal output signal 610 of differential amplifier 410 and the potential or expected output signal 620 of differential amplifier 410 are further illustrated in FIG. 6. Specifically, signal 630 illustrates the ideal output of a comparator implementing differential amplifier 410 and receiving input signal 600, and signal 640 illustrates the potential or actual output of a comparator implementing differential amplifier 410 and receiving input signal 600.

Figure 7:
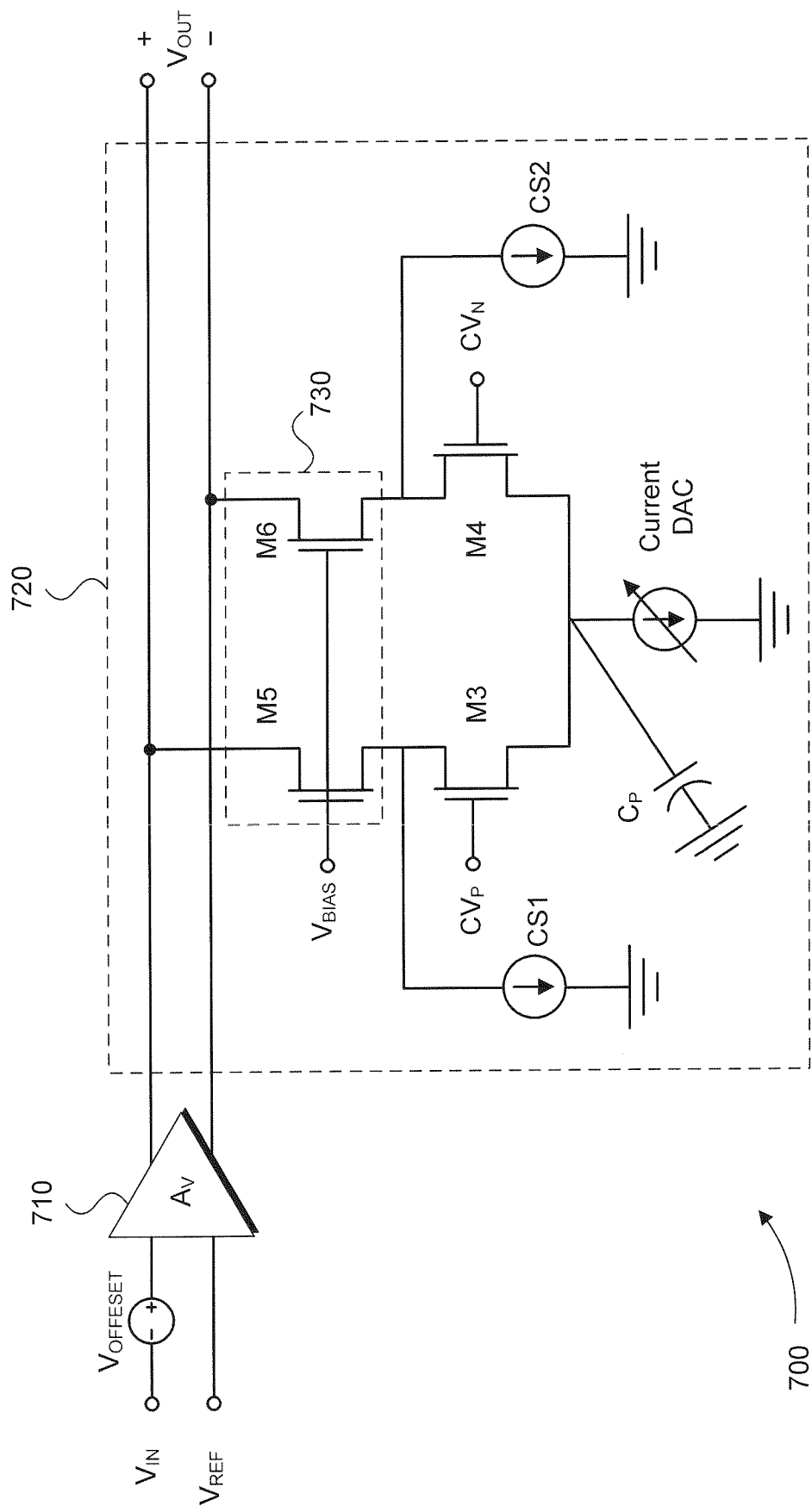
FIG. 7 illustrates a differential amplifier configuration with an offset cancellation circuit with reduced parasitic capacitance coupling, according to embodiments of the present invention.

FIG. 7 illustrates a differential amplifier configuration 700 with an offset cancellation circuit 720 with reduced parasitic capacitance coupling, according to embodiments of the present invention. The implementation of differential amplifier configuration 700 can reduce or eliminate the loading effects of parasitic capacitance $C_P$ posed by offset cancellation circuit 420 illustrated in FIG. 4.

As illustrated in FIG. 7, differential amplifier configuration 700 includes differential amplifier 710 and offset cancellation circuit 720. Differential amplifier configuration 700 has a substantially similar construction as differential amplifier configuration 400 illustrated in FIG. 4. However, offset cancellation circuit 720 has been modified to include an additional cascode stage 730 and two saturation maintenance current sources CS1 and CS2.

Cascode stage 720 includes two NMOS transistors M5 and M6 whose source/drain terminals are respectively coupled between the drains of NMOS transistors M3 and M4 and the two ends of differential output signal $V_{OUT}$. The NMOS transistors M5 and M6 are further coupled at their respective gates to bias voltage $V_{BIAS}$. Bias voltage $V_{BIAS}$, in combination with current sources CS1 and CS2 maintain NMOS transistors M5 and M6 in saturation. The two NMOS transistors M5 and M6, in saturation, have a high output impedance and provide reverse isolation. That is, NMOS transistors M5 and M6 in saturation block the signal charge from signal $V_{OUT}$ into the parasitic capacitance $C_P$. By blocking signal charge into parasitic capacitance $C_P$, the mismatched loading effect is eliminated.

It should be noted that exemplary cascode stage 720 illustrated in FIG. 7 is provided for the purpose of illustration and not limitation. Other equivalent implementations and/or variations of exemplary cascode stage 720 are possible as would be understood by a person skilled in the art based on the teachings herein. Equivalent implementations and/or variations may include, for example, variations in transistor type (e.g., PNP, BJT, JFET, etc.) and number.

In an embodiment current sources CS1 and CS2 provide equal amounts of current. In a further embodiment, the amount of current provided by CS1 and CS2 can be relatively small in magnitude compared to the total current in the two branches of differential amplifier 710.

FIG. 8 illustrates a variation on differential amplifier configuration 700 illustrated in FIG. 7, according to embodiments of the present invention. More specifically, offset cancellation circuit 720 can be implemented and coupled to the input, as opposed to the output, of differential amplifier 710 to reduce or eliminate the effects of the input referred offset voltage as will be recognized by one of ordinary skill in the art.

FIG. 9 illustrates one exemplary operating environment or device that can benefit from the use of offset cancellation circuit 720 illustrated in FIG. 7 and FIG. 8, according to embodiments of the present invention. Specifically, FIG. 9 illustrates a block diagram of an n-bit flash ADC 900. Flash ADC 900 includes a voltage reference module 910, a comparator module 920, and a thermometer to binary module 930.

In operation, flash ADC 900 is configured to receive and convert an analog voltage (or current) 940 into a binary code 950 having n-bits of precision. Binary code 950 is a digital number that is proportional to the magnitude of analog voltage 940. During the conversion process, analog voltage 940 typically is compared in parallel to $2^n-1$ voltage references provided by voltage reference module 910. In an embodiment, voltage reference module 910 is a linear voltage ladder that provides $2^n-1$ evenly spaced voltage references to comparator module 920. The linear voltage ladder can be constructed from equal valued resistors coupled in series between two voltage sources $V_{REF}+$ and $V_{REF}-$ as illustrated in FIG. 9. In another embodiment, the linear voltage ladder can be provided by capacitive voltage division.

Comparator module 920 typically includes $2^n-1$ comparators and each comparator compares analog voltage 940 to a different one of the $2^n-1$ voltage references provided by voltage reference module 910. The comparators determine whether analog voltage 940 is less than or greater than each voltage reference. In an embodiment, each comparator is configured to produce a logical one if analog voltage 940 is greater than the voltage reference and a logical zero if analog voltage 940 is less than the voltage reference. The results of these comparisons form what is referred to as a thermometer code at the output of comparator module 920. A thermometer code generally has one digital level for each possible, non-zero output code of flash ADC 900 (i.e., $2^n-1$ digital levels for an n-bit ADC). Ideally, for any given analog voltage 940, all digital levels below the value of analog voltage 940 are a logical one and all above are a logical zero. The point in the thermometer code where a logical one transitions to a logical zero is commonly referred to as the top, and the digital level at this transition point is the digital level that closely or most accurately represents analog voltage 940.

The final stage of the conversion process is performed by thermometer to binary module 930. Thermometer to binary module 930 receives the thermometer code produced by comparator module 920 and converts this code into binary code 950. Implementations of thermometer to binary module 130 are explained further below.

Ideally, there is at most a single top in any thermometer code produced. However, because of random mismatches between transistors used to implement the comparators of comparator module 920, additional tops or what are commonly referred to as bubbles are produced in thermometer code. These bubbles can result in large sparkle errors, which degrade the bit error rate (BER) of a flash ADC, such as flash ADC 900. An offset correction circuit, such as offset correction circuit 720 illustrated in FIG. 7 and FIG. 8 can be implemented by one or more of the comparators of comparator module 920 to reduce or eliminate the effects of random mismatches as described above.

It should be noted that flash ADC 900 is provided as one exemplary operating environment for offset correction circuit 720 illustrated in FIG. 7 and FIG. 8 and is provided for the purpose of illustration and not limitation. Other operating environments are possible as would be understood by a person skilled in the art based on the teachings herein.

It is to be appreciated that the Detailed Description section, and not the Abstract section, is intended to be used to interpret the claims. The Abstract section may set forth one or more but not all exemplary embodiments of the present invention as contemplated by the inventor(s), and thus, is not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

What is claimed is:

1. An offset cancellation circuit for canceling an input referred offset voltage in an amplifier, comprising:
    a current source configured to provide an offset current;
    a switching stage comprising a first switch configured to couple the offset current to a first cascode device when turned on, and a second switch configured to couple the offset current to a second cascode device when turned on; and
    a cascode stage comprising the first cascode device and the second cascode device, wherein the first cascode device is configured to receive the offset current from the first switch and inject the offset current into a first differential end of the amplifier, and the second cascode device is configured to receive the offset current from the second switch and inject the offset current into a second differential end of the amplifier.

2. The offset cancellation circuit of claim 1, further comprising:
    a first current source coupled between the first switch and the first cascode device; and
    a second current source coupled between the second switch and the second cascode device.

3. The offset cancellation circuit of claim 2, wherein the first and second current sources are respectively configured to maintain the first and second cascode devices in a saturation region of operation.

4. The offset cancellation circuit of claim 1, wherein the current source is a current mode digital-to-analog (DAC) converter.

5. The offset cancellation circuit of claim 1, wherein the first and second cascode devices are at least one of a field effect transistor and a bipolar junction transistor.

6. The offset cancellation circuit of claim 1, wherein the first and second switches are at least one of a field effect transistor and a bipolar junction transistor.

7. The offset cancellation circuit of claim 1, wherein the first differential end is a positive output of the amplifier and the second differential end is a negative output of the differential amplifier.

8. The offset cancellation circuit of claim 1, wherein the first differential end is a positive input of the amplifier and the second differential end is a negative input of the differential amplifier.

9. The offset cancellation circuit of claim 1, wherein the first and second switches are controlled such that only one of the first and second switches is on at any given point in time.

10. The offset cancellation circuit of claim 9, wherein the first and second switches are controlled based on whether the input referred offset voltage is positive or negative in value.

11. A comparator, comprising:
    an amplifier for providing an output signal based on a difference between a first input signal and a second input signal, wherein the amplifier has an input referred offset voltage that shifts the output signal; and
    an offset cancellation circuit for canceling the input referred offset voltage, the offset cancellation circuit comprising:
        a current source configured to provide an offset current;

a switching stage comprising a first switch configured to couple the offset current to a first cascode device when turned on, and a second switch configured to couple the offset current to a second cascode device when turned on; and a cascode stage comprising the first cascode device and the second cascode device, wherein the first cascode device is configured to receive the offset current from the first switch and inject the offset current into a first differential end of the amplifier, and the second cascode device is configured to receive the offset current from the second switch and inject the offset current into a second differential end of the amplifier.

12. The amplifier of claim 11, further comprising:

a first current source coupled between the first switch and the first cascode device; and a second current source coupled between the second switch and the second cascode device.

13. The amplifier of claim 12, wherein the first and second current sources are respectively configured to maintain the first and second cascode devices in a saturation region of operation.

14. The amplifier of claim 11, wherein the current source is a current mode digital-to-analog (DAC) converter.

15. The amplifier of claim 11, wherein the first and second cascode devices are at least one of a field effect transistor and a bipolar junction transistor.

16. The amplifier of claim 11, wherein the first and second switches are at least one of a field effect transistor and a bipolar junction transistor.

17. The amplifier of claim 11, wherein the first and second differential ends of the amplifier provide the output signal.

18. The amplifier of claim 11, wherein the first and second differential ends of the amplifier receive the first and second input signals.

19. The amplifier of claim 11, wherein the first and second switches are controlled such that only one of the first and second switches is on at any given point in time.

20. The amplifier of claim 19, wherein the first and second switches are controlled based on whether the input referred offset voltage is positive or negative in value.

* * * * *